United States Patent
Chen et al.

(10) Patent No.: US 12,294,067 B2
(45) Date of Patent: May 6, 2025

(54) METHOD, APPARATUS AND SYSTEM FOR THERMAL RUNAWAY PROCESSING AND STORAGE MEDIUM

(71) Applicant: CONTEMPORARY AMPEREX TECHNOLOGY (HONG KONG) LIMITED, Hong Kong (CN)

(72) Inventors: Xiaobo Chen, Ningde (CN); Jianhuang Ke, Ningde (CN); Yao Li, Ningde (CN)

(73) Assignee: Contemporary Amperex Technology (Hong Kong) Limited, Hong Kong (CN)

( * ) Notice: Subject to any disclaimer, the term of this patent is extended or adjusted under 35 U.S.C. 154(b) by 346 days.

(21) Appl. No.: 17/834,928

(22) Filed: Jun. 8, 2022

(65) Prior Publication Data

US 2022/0302514 A1 Sep. 22, 2022

Related U.S. Application Data

(63) Continuation of application No. PCT/CN2021/131273, filed on Nov. 17, 2021.

(30) Foreign Application Priority Data

Dec. 31, 2020 (CN) .......................... 202011626769.6

(51) Int. Cl.
*H01M 10/48* (2006.01)
*H01M 10/613* (2014.01)
(Continued)

(52) U.S. Cl.
CPC ....... *H01M 10/482* (2013.01); *H01M 10/613* (2015.04); *H01M 10/625* (2015.04); *H01M 10/6567* (2015.04)

(58) Field of Classification Search
CPC ............. H01M 10/482; H01M 10/613; H01M 10/625; H01M 10/6557;
(Continued)

(56) References Cited

U.S. PATENT DOCUMENTS 7,433,794 B1 10/2008 Berdichevsky et al.
8,846,232 B2 * 9/2014 Tse ...................... H01M 10/613
429/90

(Continued)

FOREIGN PATENT DOCUMENTS

CN 102624058 A 8/2012
CN 110525219 A 12/2019
(Continued)

OTHER PUBLICATIONS

CN 111430840A Machine Translation (Year: 2020).*
(Continued)

*Primary Examiner* — Len Tran
*Assistant Examiner* — Gustavo A Hincapie Serna
(74) *Attorney, Agent, or Firm* — East IP P.C.

(57) ABSTRACT

The embodiments of the present application provide a method, apparatus and system for thermal runaway processing and a storage medium. The method first obtains a battery parameter for each of a plurality of battery modules in a power battery pack, then determines that a thermal runaway is occurred in a first battery module based on the battery parameter for each of the plurality of battery modules; and then obtains a second battery module based on the first battery module, wherein the second battery module corresponds to at least one battery module excluding the first battery module in the power battery pack; and finally supplies power to a chiller system with the second battery module.

9 Claims, 5 Drawing Sheets

(51) Int. Cl.
*H01M 10/625* (2014.01)
*H01M 10/6567* (2014.01)

(58) Field of Classification Search
CPC . H01M 2010/4271; H01M 2010/4278; H01M 2220/20; H01M 10/42; B60L 2240/545; B60L 3/0092; B60L 58/10; B60L 58/21; B60L 3/0046; B60L 58/26; G01R 31/36; Y02E 60/10
USPC .................................................. 702/132, 136
See application file for complete search history.

(56) References Cited

U.S. PATENT DOCUMENTS

| | | | | |
|---|---|---|---|---|
| 8,993,145 | B2* | 3/2015 | Muniz | H01M 10/617 429/62 |
| 9,046,580 | B2* | 6/2015 | Hermann | B60L 58/21 |
| 9,343,911 | B2* | 5/2016 | LePort | H02J 7/0014 |
| 9,954,259 | B1* | 4/2018 | Grace | B60L 58/26 |
| 10,481,623 | B1* | 11/2019 | Forouzan | G05B 13/048 |
| 10,994,617 | B2* | 5/2021 | Rahbari Asr | B60L 3/12 |
| 11,802,918 | B2* | 10/2023 | Lee | G01R 31/392 |
| 11,804,630 | B2* | 10/2023 | Whitman | H01M 50/574 |
| 11,888,131 | B1* | 1/2024 | Zhang | H01M 50/244 |
| 2012/0034501 | A1* | 2/2012 | Hermann | H01M 10/613 429/62 |
| 2013/0312947 | A1* | 11/2013 | Bandhauer | H01M 10/6556 429/62 |
| 2014/0067297 | A1* | 3/2014 | Prada | H01M 10/486 702/63 |
| 2014/0339920 | A1* | 11/2014 | Ingalls, Jr. | H02J 7/0013 324/426 |
| 2015/0255838 | A1* | 9/2015 | Inoue | H01M 10/625 429/62 |
| 2015/0380784 | A1* | 12/2015 | Bass | H01M 10/625 429/120 |
| 2017/0117725 | A1* | 4/2017 | Hendricks | G01K 1/026 |
| 2018/0013105 | A1* | 1/2018 | Wuensche | H01M 10/425 |
| 2018/0138478 | A1* | 5/2018 | Chan | H01M 50/271 |
| 2019/0214691 | A1* | 7/2019 | Saroka | H01M 10/6554 |
| 2019/0267675 | A1* | 8/2019 | Le | H01M 10/42 |
| 2019/0356023 | A1* | 11/2019 | Tenorio | H01M 10/39 |
| 2020/0212507 | A1 | 7/2020 | Shimizu et al. | |
| 2020/0266402 | A1* | 8/2020 | Myung | H01M 50/271 |
| 2021/0138931 | A1* | 5/2021 | Yoshida | H01M 10/663 |
| 2021/0151808 | A1* | 5/2021 | Feng | H01M 10/6567 |
| 2021/0226280 | A1* | 7/2021 | Dieckmann | H01M 10/613 |
| 2021/0384585 | A1* | 12/2021 | Ando | H01M 50/392 |
| 2022/0102802 | A1* | 3/2022 | Whitman | H01M 10/633 |
| 2022/0158149 | A1* | 5/2022 | Schwarzwalder | H01M 10/617 |
| 2022/0158265 | A1* | 5/2022 | Werner | H01M 10/6568 |
| 2022/0161078 | A1* | 5/2022 | Baeder | H01M 50/209 |
| 2022/0266695 | A1* | 8/2022 | Pressman | B60L 50/60 |
| 2022/0376336 | A1* | 11/2022 | Jang | H01M 50/289 |
| 2023/0104203 | A1* | 4/2023 | Chen | C08K 3/36 524/500 |
| 2023/0170558 | A1* | 6/2023 | Fuchs | H01M 10/643 429/433 |
| 2023/0387515 | A1* | 11/2023 | Dandl | H01M 50/103 |

FOREIGN PATENT DOCUMENTS

| | | | |
|---|---|---|---|
| CN | 111430840 A | * 7/2020 | ............. B60L 58/26 |
| CN | 112043995 A | 12/2020 | |
| CN | 112751104 A | 5/2021 | |
| CN | 113161647 A | 7/2021 | |
| CN | 113285140 A | 8/2021 | |
| JP | H1140204 A | 2/1999 | |
| JP | 2001043 902 A | 2/2001 | |
| JP | 2011120423 A | 6/2011 | |
| JP | 2016018638 A | 2/2016 | |
| JP | 2018063766 A | 4/2018 | |
| JP | 2020187822 A | 11/2020 | |
| KR | 1020190056081 A | 5/2019 | |
| WO | 2019039120 A1 | 2/2019 | |

OTHER PUBLICATIONS

The First Office Action for KR Application No. 10-2022-7019065, dated Jul. 5, 2024, 14 pages.
The extended European search report for European Application No. 21899277.4, dated Jul. 17, 2024, 10 pages.
The First Office Action for JP Application No. 2022-533077, dated Sep. 4, 2023, 10 pages.
The Second Office Action for CN Application No. 20201 1626 769.6, dated Oct. 18, 2023, 11 pages.
The International search report for PCT Application No. PCT/CN2021/131273, dated Feb. 10, 2022, 12 pages.

* cited by examiner

METHOD, APPARATUS AND SYSTEM FOR THERMAL RUNAWAY PROCESSING AND STORAGE MEDIUM

CROSS REFERENCE TO RELATED APPLICATION

This application is a continuation of International Application No. PCT/CN2021/131273 filed on Nov. 17, 2021, which claims the priority to Chinese Patent Application No. 202011626769.6, filed on Dec. 31, 2020 and entitled "METHOD, APPARATUS AND SYSTEM FOR THERMAL RUNAWAY PROCESSING AND STORAGE MEDIUM", both of which are hereby incorporated by reference in their entireties.

TECHNICAL FIELD

The present application relates to the field of battery heat dissipation, in particular to a method, apparatus and system for thermal runaway processing and a storage medium.

BACKGROUND

The thermal runaway of a battery refers to the fact that uncontrollable chain decomposition reactions are occurred in a power battery due to some reasons, which results in a sharply rise of the internal temperature, and eventually results in a failure of the battery core, which is accompanied by a generation of a large amount of gas and heat. The reasons for the thermal runaway include but are not limited to a mechanical collision, an internal short circuit, an overcharge, an overheating and so on.

After the thermal runaway of the battery is occurred, resulting from a influence of conductive metal debris erupted along with an insulation thermal failure and the thermal runaway of the battery, a high-voltage ignition phenomenon may be frequently occurred in the battery pack, which leads to risks of a breakdown of a battery pack upper cover, a overcurrent temperature raise, and a cell breakdown failure of the battery pack, and then leads to a severe thermal spread inside the battery pack, a generation of a large amount of heat, and a sharply rising of temperature of the battery pack. As a result, the safety of the battery pack is poor.

When the thermal runaway is occurred, the system high-voltage circuits in the current battery pack will be passively cut off, which results in that the chiller system cannot operate normally. Thus, the battery pack cannot be effectively cooled and dissipated heat, and the safety of the battery pack is reduced.

SUMMARY

In a first aspect, an embodiment of the application provides a method for thermal runaway processing, including:
obtaining a battery parameter for each of a plurality of battery modules, wherein the plurality of battery modules form a power battery pack;
determining that a thermal runaway is occurred in a first battery module based on the battery parameter for each of the plurality of battery modules;
obtaining a second battery module based on the first battery module, wherein the second battery module corresponds to at least one battery module excluding the first battery module in the power battery pack; and
supplying power to a chiller system with the second battery module, wherein the chiller system is configured to cool the power battery pack.

In some embodiments, obtaining the second battery module based on the first battery module includes:
obtaining the second battery module based on the first battery module and a rated voltage of the chiller system, wherein an output voltage of the second battery module is greater than or equal to the rated voltage of the chiller system.

In some embodiments, obtaining the second battery module based on the first battery module includes:
sending, to a vehicle control unit (VCU), first information which includes information of the first battery module, so as to cause the VCU to generate second information based on a rated voltage of the chiller system and the information of the first battery module; and
obtaining the second information sent by the VCU, wherein the second information includes information of the second battery module.

In some embodiments, obtaining the second battery module based on the first battery module includes:
obtaining the rated voltage of the chiller system sent by a Vehicle Control Unit (VCU); and
obtaining the second battery module based on the rated voltage of the chiller system and the first battery module.

In some embodiments, obtaining the second battery module based on the first battery module includes:
obtaining the second battery module, under a condition that a voltage difference between voltages at a highest voltage terminal and a lowest voltage terminal of a power supply circuit of the second battery module is less than or equal to a first preset threshold, and/or
under a condition that a power of the power supply circuit of the second battery module is greater than a second preset threshold.

In some embodiments, obtaining the second battery module based on the first battery module includes:
sending, to a vehicle control unit (VCU), a voltage difference between voltages at a highest voltage terminal and a lowest voltage terminal of a power supply circuit of the second battery module, so as to cause the VCU to feed back information of the second battery module based on the voltage difference, wherein the VCU is configured to feed back the information of the second battery module under a condition that the voltage difference is less than or equal to a first preset threshold; and
obtaining the information of the second battery module.

In some embodiments, the battery parameter includes a real-time voltage of a battery module,
wherein determining that the thermal runaway is occurred in the first battery module based on the battery parameter for each of the plurality of battery modules includes:
determining that the thermal runaway is occurred in the first battery module, under a condition that a difference between a real-time voltage of the first battery module and a reference voltage is greater than or equal to a third preset threshold, and/or
under a condition that a rate of change on the real-time voltage of the first battery module is greater than or equal to a fourth preset threshold, and/or
under a condition that a sampling for the real-time voltage of the first battery module is abnormal.

In a second aspect, an embodiment of the application provides an apparatus for thermal runaway processing, including:

an obtaining module configured to obtain a battery parameter for each of a plurality of battery modules, wherein the plurality of battery modules form a power battery pack; and a processing module configured to determine that a thermal runaway is occurred in a first battery module based on the battery parameter for each of the plurality of battery modules, wherein the processing module is further configured to obtain a second battery module based on the first battery module, wherein the second battery module corresponds to at least one battery module excluding the first battery module in the power battery pack, and the processing module is further configured to supply power to a chiller system with the second battery module, wherein the chiller system is configured to cool the power battery pack.

In some embodiments, the processing module is configured to:

obtain the second battery module based on the first battery module and a rated voltage of the chiller system, wherein an output voltage of the second battery module is greater than or equal to the rated voltage of the chiller system.

In some embodiments, the processing module is configured to:

send, to a vehicle control unit (VCU), first information which includes information of the first battery module, so as to cause the VCU to generate second information based on the rated voltage of the chiller system and the information of the first battery module; and obtain the second information sent by the VCU, wherein the second information includes information of the second battery module.

In some embodiments, the processing module is configured to:

obtain the rated voltage of the chiller system sent by a Vehicle Control Unit (VCU); and obtain the second battery module based on the rated voltage of the chiller system and the first battery module.

In some embodiments, the processing module is configured to:

obtain the second battery module, under a condition that a voltage difference between voltages at a highest voltage terminal and a lowest voltage terminal of a power supply circuit of the second battery module is less than or equal to a first preset threshold, and/or under a condition that a power of the power supply circuit of the second battery module is greater than a second preset threshold.

In some embodiments, the processing module is configured to:

send, to a vehicle control unit (VCU), a voltage difference between voltages at a highest voltage terminal and a lowest voltage terminal of a power supply circuit of the second battery module, so as to cause the VCU to feed back information of the second battery module based on the voltage difference, wherein the VCU is configured to feed back the information of the second battery module under a condition that the voltage difference is less than or equal to a first preset threshold; and obtain the information of the second battery module.

In some embodiments, the battery parameter includes a real-time voltage of a battery module, and the processing module is configured to:

determine that the thermal runaway is occurred in the first battery module, under a condition that a difference between a real-time voltage of the first battery module and a reference voltage is greater than or equal to a third preset threshold, and/or under a condition that a rate of change on the real-time voltage of the first battery module is greater than or equal to a fourth preset threshold, and/or under a condition that a sampling for the real-time voltage of the first battery module is abnormal.

In a third aspect, an embodiment of the present application provides a battery management system, including:

at least one processor; and a memory communicatively coupled to the at least one processor, wherein the memory is stored with instructions executable by the at least one processor, and the instructions, when executed by the at least one processor, cause the at least one processor to perform the method for thermal runaway processing as described above.

In a fourth aspect, an embodiment of the present application provides a non-transitory computer-readable storage medium, wherein the non-transitory computer-readable storage medium is stored with computer-executable instructions for implementing the method for thermal runaway processing as described above.

In a fifth aspect, an embodiment of the present application provides a system for thermal runaway processing, including the battery management system as described above.

Compared with the prior art, the application has at least the following beneficial effects that: the method for thermal runaway processing of the application includes first obtaining a battery parameter for each of a plurality of battery modules in a power battery pack; then determining that a thermal runaway is occurred in a first battery module based on the battery parameter for each of the plurality of battery modules; and obtaining a second battery module based on the first battery module, wherein the second battery module corresponds to at least one battery module excluding the first battery module in the power battery pack; and finally supplying power to a chiller system with the second battery module. Therefore, when the thermal runaway is occurred in the battery module in the power battery pack, the method for thermal runaway processing may supply power to the chiller system with the second battery module in which the thermal runaway is not occurred, to cause the chiller system to operate normally, to take away the heat in the power battery pack which is generated due to the thermal runaway, and to cool the power battery pack and dissipate heat from the power battery pack, and thus a good heat dissipation effect is achieved, and the safety of the power battery pack is improved.

BRIEF DESCRIPTION OF THE DRAWINGS

One or more embodiments are exemplified by the figures in the drawings corresponding thereto, and these exemplary illustrations do not limit the embodiments, and elements with the same reference numbers in the drawings are represented as similar elements, unless otherwise stated, the figures in the drawings do not constitute a scale limitation.

Figure 1:
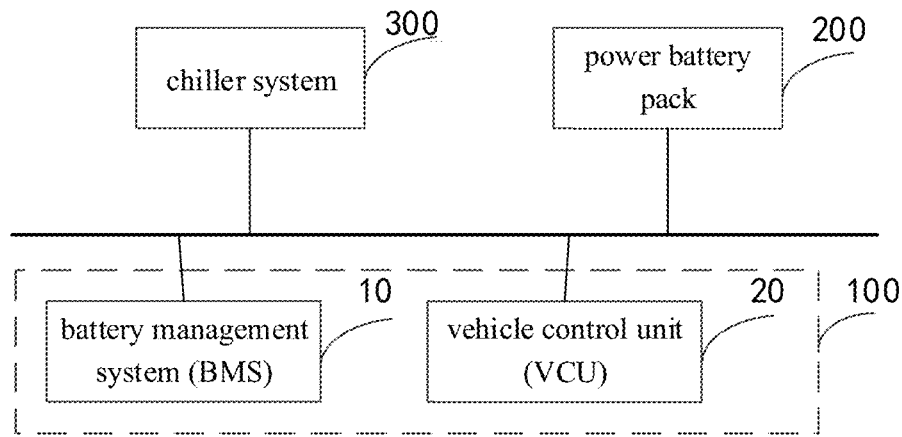
FIG. 1 is a schematic structure diagram of a system for thermal runaway processing provided by an embodiment of the present application.

In the drawings, the figures are not drawn to actual scale.

Description of reference numbers: system for thermal runaway processing 100; battery management system 10; processor 101; memory 102; vehicle control unit 20; power battery pack 200; chiller system 300; apparatus for thermal runaway processing 800; obtaining module 801; and processing module 802.

DETAILED DESCRIPTION

In order to make the purpose, technical solutions and advantages of the application clearer, the application will be described in further detail below in connection with the drawings and embodiments. It should be understood that the specific embodiments described herein are only used for explaining the present application, but not for limiting the present application. Based on the embodiments in the present application, all other embodiments obtained by an ordinary person skilled skill in the art without the exercise of inventive faculty shall fall within the protection scope of the present application.

It should be noted that, if there is no conflict, the respective features in various embodiments of the present application may be combined with each other, which shall fall within the protection scope of the present application. In addition, although there are divided functional modules in the schematic diagrams of the device, and logical sequences are shown in the flowcharts, in some cases, the steps shown or described may be performed by modules of the device which are divided differently, or in an order different from the orders in the sequences in the flowcharts. Further, the words "first", "second" and "third" used in this application do not limit the data and execution order, but only distinguish the same or similar items with basically the same function and effect.

Please refer to FIG. 1. FIG. 1 is a system for thermal runaway processing provided by an embodiment of the present application. The system for thermal runaway processing 100 includes a battery management system 10 (BMS for short). The system for thermal runaway processing 100 is configured to, when the thermal runaway is occurred in a power battery pack 200, supply power to a chiller system 300 with the power battery pack 200, so as to cool the power battery pack 200. The power battery pack 200 includes a plurality of battery modules, and each battery module is communicatively coupled to the battery management system 10. The battery modules in the power battery pack 200 may form various power supply circuits.

When the power battery pack 200 is operated normally, the plurality of battery modules are connected in series or in parallel via high-voltage wire harnesses, to form a power battery system, to supply high-voltage power to other components. When the thermal runaway is to or has been occurred in single or several battery modules in the power battery pack 200, the battery management system 10 may identify the thermal runaway phenomenon based on the battery parameter(s) of the battery module(s), then determine a first battery module in which the thermal runaway is occurred, and then shield the battery module(s) in which the thermal runaway is occurred, obtain a second battery module which corresponds to at least one battery module excluding the first battery module in the power battery pack 200, and form a high-voltage power supply circuit with the battery module(s) in which the thermal runaway is not occurred, i.e., the second battery module, to supply power to the chiller system 300, to start the chiller system 300, so as to cool the power battery pack 200 and dissipate heat from it.

The chiller system 300 includes a water pump and a chiller, wherein the water pump may be powered by a low-voltage system (12V). After the water pump is started, the cooling liquid is circulated, and the cooling liquid enters the cold plate in the power battery pack 200, to cool down it, which achieves a certain heat dissipation effect. While the chiller is powered by the high-voltage circuit formed by the battery module(s) in which the thermal runaway is not occurred, so that the chiller is driven to be operated normally. The refrigerant is introduced into the chiller from one side and the cooling liquid is introduced into the chiller from another side, the refrigerant and the cooling liquid exchange heat in the chiller sufficiently, the heat in the cooling liquid is taken away by the refrigerant, and the cooled cooling liquid flows out of the chiller and then flows into the power battery pack to dissipate heat from it, such that a cycle is formed. The chiller may forcibly cool the cooling liquid, greatly improve the cooling efficiency of the cooling liquid, by which the heat inside the power battery pack 200 can be take away quickly. The system for thermal runaway processing 100 may supply power to the chiller system 300 with the battery module(s) in which the thermal runaway is not occurred, which may, compared with the scheme without a high-voltage circuit for supplying power to the chiller system 300, improve the cooling efficiency of the cooling liquid greatly, improve the heat dissipation effect for the power battery pack 200 by the chiller system 300, and improve the safety of the power battery pack 200.

In some embodiments, the system for thermal runaway processing 100 further includes a vehicle control unit 20 (VCU for short), the VCU 20 is communicatively coupled to the battery management system 10. The battery management system 10 may transmit a battery parameter for each battery module to the VCU 20, such that the VCU 20 processes and analyzes the battery parameter, to determine the battery module in which the thermal runaway is occurred, i.e., the first battery module. The VCU 20 may further obtain the second battery module, i.e., the battery module(s) in which the thermal runaway is not occurred, based on the battery module in which the thermal runaway is occurred and based on a rated voltage of the chiller system, and send, to the battery management system 10, the information of the battery module(s) in which the thermal runaway is not occurred, such that the battery management system 10 supplies power to the chiller system 300 with the second battery module, and thus the good cool down and heat dissipation effects for the power battery pack 200 are achieved and the safety of the power battery pack 200 is improved.

In other embodiments, the battery management system 10 may obtain the rated voltage of the chiller system 300 sent by the VCU 20, and then obtain the second battery module based on the rated voltage of the chiller system 300 and the first battery module, i.e., obtain the battery module(s) in which the thermal runaway is not occurred. The battery management system 10 then supplies power to the chiller system 300 with the second battery module, to cause the chiller system 300 to cool the power battery pack 200 and dissipate heat from it.

To sum up, the system for thermal runaway processing may supply power to the chiller system with the second battery module in which the thermal runaway is not occurred, to cause the chiller system to operate normally, to take away the heat inside the power battery pack which is generated due to thermal runaway, and to cool the power battery pack and dissipate heat from it, which achieves a good heat dissipation effect and improves the safety of the power battery pack.

Figure 2:
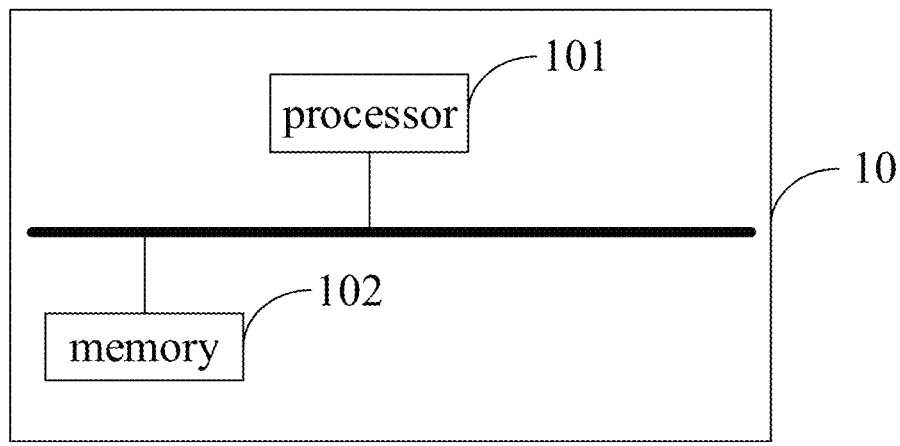
FIG. 2 is a schematic hardware structure diagram of a battery management system provided by an embodiment of the present application.

Please refer to FIG. 2, the battery management system 10 may be provided with: at least one processor 101 (one processor is illustrated as an example in FIG. 2) and a memory 102 which are communicatively coupled with each other by system buses or other means.

The processor 101 is configured to provide computing and control capabilities, to control the battery management system to implement thermal runaway processing and perform related tasks, for example, to control the battery management system 10 to perform the method for thermal runaway processing provided by any one of the following embodiments.

The memory 102, as a non-transitory computer-readable storage medium, may be used for storing non-transitory software programs, non-transitory computer-executable programs and modules, such as program instructions/modules corresponding to the method for thermal runaway processing in any of the following embodiments. The processor 101 may implement the method for thermal runaway processing in any of the following embodiments by running the non-transitory software programs, instructions and modules stored in the memory 102. In particular, the memory 102 may include a high-speed random access memory, and may further include anon-transitory memory, for example, at least one magnetic disk storage device, a flash memory device, or other non-transitory solid-state storage device.

Figure 3:
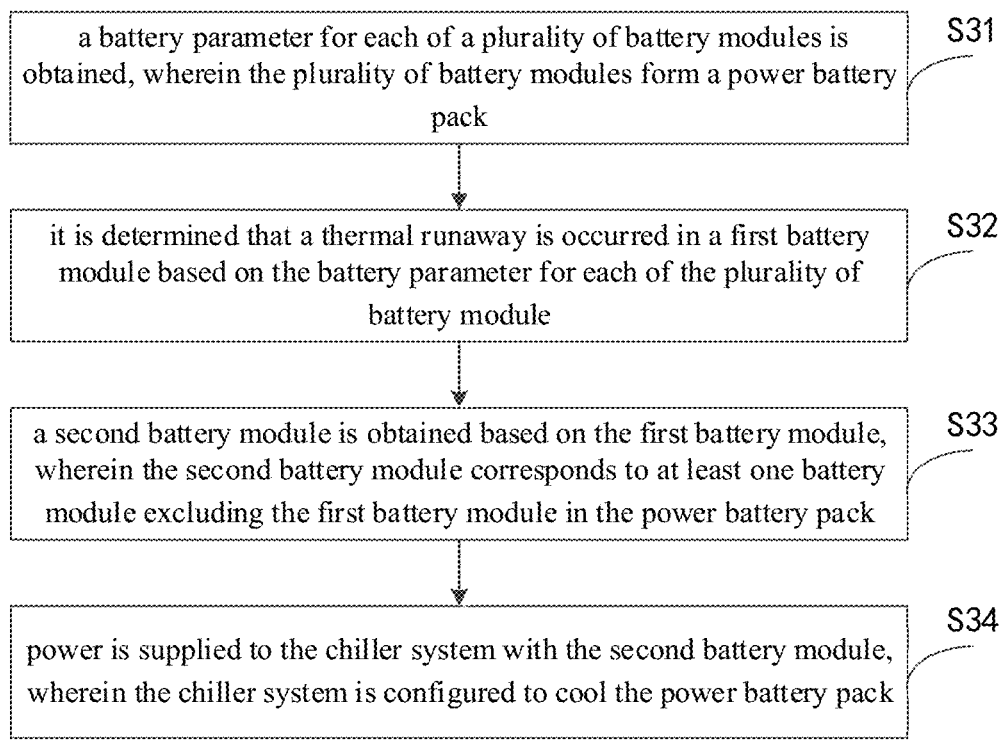
FIG. 3 is a schematic flowchart of a method for thermal runaway processing provided by an embodiment of the present application.

Please refer to FIG. 3, FIG. 3 is a schematic flowchart of a method for thermal runaway processing provided by an embodiment of the present application. The method may be performed by any type of battery management system, such as the battery management system shown in FIG. 1.

In particular, referring to FIG. 3, the method may include but not limited to the following steps.

In S31, a battery parameter for each of a plurality of battery modules is obtained, wherein the plurality of battery modules form a power battery pack.

The power battery pack includes the plurality of battery modules, and the plurality of battery modules are connected in series or in parallel via high-voltage wire harnesses, to form a power battery system. The characteristic of each battery module may be represented by its battery parameter. In particular, the battery parameter includes but is not limited to a real-time voltage of the battery module, a real-time output current/power of the battery module, a reference voltage of the battery module, and a sampling signal for sampling the battery module and so one. Each battery module includes n cells, each cell has a cell parameter such as a cell reference voltage, a cell real-time voltage and so on. A total voltage of then cells is the voltage of the battery module. Therefore, the battery parameter of the battery module may further be represented by the cell parameters of the cells in the battery module.

In S32, it is determined that a thermal runaway is occurred in a first battery module based on the battery parameter for each of the plurality of battery module.

When the thermal runaway is occurred in a certain battery module, its battery parameter deviates from a reference value, and based on the deviation, it may be determined that the thermal runaway is occurred in the battery module. In particular, it may be determined that the thermal runaway is occurred in the first battery module, under a condition that a difference between the real-time voltage of the first battery module and a reference voltage is greater than or equal to a third preset threshold, and/or under a condition that a rate of change on the real-time voltage of the battery module is greater than or equal to a fourth preset threshold, and/or under a condition that a sampling for the real-time voltage of the battery module is abnormal. The reference voltage is a voltage of the battery module before the thermal runaway is occurred in it, the sampling for the real-time voltage of the battery module being abnormal may indicate that the communication to the sensor for sampling the real-time voltage of the battery module is abnormal, and the third preset threshold and the fourth preset threshold may be set as required.

In other embodiments, it is also possible to determine the first battery module in which the thermal runaway is occurred based on the cell parameters of the cells in the battery module. Each of the cells in the battery module may be identified accordingly, and if there is an abnormality in a cell, it is determined that the thermal runaway is occurred in the battery module including the cell. In particular, it may be determined that the thermal runaway is occurred in the battery module, under a condition that a difference between a real-time voltage of the cell and a cell reference voltage is greater than or equal to a set threshold, and/or under a condition that a rate of change on the real-time voltage of the cell is greater than or equal to a set threshold, and/or under a condition that the communication to the sensor for sampling the real-time voltage at the corresponding position of the cell is abnormal, and/or a difference between a total voltage of the battery module including the cell and n*V1 (wherein n is the number of the cells included in the battery module, and V1 is the cell reference voltage) is greater than or equal to a set threshold.

The number of battery modules included in the first battery module is the number of the battery modules in which the thermal runaway is occurred. If the thermal runaway is occurred in a No. 1 battery module in the power battery pack, the first battery module includes only the No. 1 battery module. If the thermal runaway is occurred in the No. 1 battery module, a No. 3 battery module and a No. 4 battery module, the first battery module includes the No. 1 battery module, the No. 3 battery module and the No. 4 battery module.

In S33, a second battery module is obtained based on the first battery module, wherein the second battery module corresponds to at least one battery module excluding the first battery module in the power battery pack.

The second battery module corresponds to a portion or even all of the battery modules in which the thermal runaway is not occurred. The second battery module is selected from the battery modules in which the thermal runaway is not occurred, based on a certain selection strategy. The second battery module may form a high-voltage safety power supply circuit via series or parallel connection, to supply power to the chiller system.

The selection strategy may include a variety of strategies, for example, the second battery module may be selected based on the rated voltage and/or rated power and/or rated current of the chiller system and so on, or based on the temperature of the cooling liquid in the chiller system, or based on a battery temperature in the power battery pack or other conditions. In particular, in some embodiments, if the second battery module is selected based on the rated voltage of the chiller system, the second battery module is obtained based on the first battery module and the rated voltage of the chiller system, wherein an output voltage of the second battery module is greater than or equal to the rated voltage of the chiller system. The output voltage of the high-voltage circuit formed by the second battery module may ensure the normal operation of the chiller system. For example, if the battery modules in which the thermal runaway is not occurred are the No. 1 battery module, the No. 3 battery module and the No. 4 battery module, and only the output voltage of a series circuit formed by the No. 1 battery module, the No. 3 battery module and the No. 4 battery module is greater than the rated voltage of the chiller system, the No. 1 battery module, the No. 3 battery module and the No. 4 battery are selected as the second battery module.

In some embodiments, if the second battery module is selected based on the rated power of the chiller system, the second battery module is obtained based on the first battery module and the rated power of the chiller system, wherein an output power of the second battery module is greater than or equal to the rated power of the chiller system. The output voltage of the high-voltage circuit formed by the second battery module may ensure the normal operation of the chiller system. For example, if the battery modules in which the thermal runaway is not occurred are the No. 1 battery module, the No. 3 battery module and the No. 4 battery module, and the output voltage of a series circuit formed by the No. 1 battery module and the No. 4 battery module is greater than the rated voltage of the chiller system, the No. 1 battery module and the No. 4 battery are selected as the second battery module.

In other embodiments, if the second battery module is selected based on the rated voltage of the chiller system and the battery temperature in the power battery pack, or the second battery module is selected based on the rated voltage of the chiller system and the temperature of the cooling liquid, and the battery modules in which the thermal runaway is not occurred may form multiple high-voltage circuits, and the output voltage of each of the multiple high-voltage circuits is greater than the rated voltage of the chiller system, the second battery may be further selected based on the battery temperature in the power battery pack or the temperature of the cooling liquid. In particular, when the battery temperature is higher than a first battery temperature threshold, or the temperature of the outflow cooling liquid is higher than a first cooling liquid temperature threshold, the battery module(s) with higher output power is selected as the second battery module; or when the battery temperature is lower than the first battery temperature threshold and higher than a second battery temperature threshold, or the temperature of the outflow cooling liquid is lower than the first cooling liquid temperature threshold and higher than a second cooling liquid temperature threshold, the battery module(s) with lower output power is selected as the second battery module. For example, the battery modules in which the thermal runaway is not occurred are the No. 1 battery module, the No. 3 battery module and the No. 4 battery module, and if an output voltage of a power supply circuit formed by the No. 1 battery module and the No. 3 battery module is greater than the rated voltage of the chiller system and an output power of this power supply circuit is P1, and an output voltage of a power supply circuit formed by the No. 1 battery module and the No. 4 battery module is also greater than the rated voltage of the chiller system and an output power of this power supply circuit is P2, and P1 is greater than P2, the second battery module may be further selected based on the battery temperature in the power battery pack or the temperature of the cooling liquid. If the battery temperature in the power battery pack is higher than the first battery temperature threshold or the temperature of the outflow cooling liquid is higher than the first cooling liquid temperature threshold, the No. 1 battery module and the No. 3 battery module are selected as the second battery module; or if the battery temperature is lower than the first battery temperature threshold and higher than the second battery temperature threshold, or the temperature of the outflow cooling liquid is lower than the first cooling liquid temperature threshold and higher than the second cooling liquid temperature threshold, the No. 1 battery module and the No. 4 battery module are selected as the second battery module.

In some embodiments, the battery management system and the VCU exchange information with each other, and then the battery management system selects the second battery module based on a selection strategy. In particular, the battery management system receives the rated voltage of the chiller system sent by the vehicle control unit (VCU), and obtain the second battery module based on the rated voltage of the chiller system and the first battery module.

The rated voltage of the chiller system may be stored in the VCU in advance, the VCU sends the rated voltage to the battery management system, and the battery management system obtains the rated voltage and obtains the information of the first battery module, and then obtains the second battery module based on the rated voltage and the first battery module. The detail selection strategy may refer to the above described embodiments.

In some embodiments, the sensor for detecting the temperature of the cooling liquid may further transmit the detected temperature of the cooling liquid to the VCU, and the VCU transmits the temperature of the cooling liquid together with the rated voltage of the chiller system to the battery management system, such that the battery management system then selects the second battery module based on the temperature of the cooling liquid and the rated voltage of the chiller system.

In some embodiments, the sensor for detecting the battery temperature in the power battery pack transmits the detected battery temperature to the battery management system, the VCU transmits the rated voltage of the chiller system to the battery management system, and the battery management system selects the second battery module based on the battery temperature and the rated voltage of the chiller system.

In S34, power is supplied to the chiller system with the second battery module, wherein the chiller system is configured to cool the power battery pack.

The second battery module forms a power supply circuit via high-voltage wire harnesses, to supply power to the chiller system, in particular, to the chiller in the chiller system, so that the cooling liquid may be forced to be refrigerated. The water pump in the chiller system may be driven by other low-voltage power, to enable the cooling liquid to be circulated in the battery pack. When the thermal runaway is occurred in the power battery pack, the chiller system may operate normally, to cool the power battery pack, take away the heat generated due to the thermal runaway, and may force refrigerate the cooling liquid of which the temperature is raised by absorbing the heat from the thermal runaway of the battery, which greatly improves the cooling efficiency of the cooling liquid and improves the heat dissipation effect.

To sum up, when the thermal runaway is occurred in the battery module in the power battery pack, the method for thermal runaway processing may supply power to the chiller system with the second battery module in which the thermal runaway is not occurred, to cause the chiller system to operate normally, to take away the heat in the power battery pack which is generated due to the thermal runaway, and to cool the power battery pack and dissipate heat from the power battery pack, and thus a good heat dissipation effect is achieved, and the safety of the power battery pack is improved.

In some embodiments, when obtaining the second battery module, it is further necessary to detect whether a power supply circuit that may be formed by the second battery module is available, and the detecting of the power supply circuit of the second battery module is mainly based on a voltage difference or a power of the power supply circuit of the second battery module. In particular, the second battery module is obtained, under a condition that a voltage difference between voltages at a highest voltage terminal and a lowest voltage terminal of the power supply circuit of the second battery module is less than or equal to a first preset threshold, and/or under a condition that a power of the power supply circuit of the second battery module is greater than a second preset threshold.

That is, when the voltage difference of the power supply circuit of the second battery module is normal and/or the power of the power supply circuit is normal, it indicates that the power supply circuit of the second battery module is available, and then the second battery module is obtained. If a certain high-voltage wiring harness among the second battery module has an abnormality such as an open circuit, or if switch unit(s) are used for connection among the second battery module, and during the forming of a power supply circuit, the control signal for the switch unit(s) is abnormal and thus the switch unit cannot be turned on or turned off normally, the voltage difference of the power supply circuit of the second battery module will be abnormal and/or the power of the power supply circuit will be abnormal, and the second battery module should be re-obtained.

Before re-obtaining the second battery module, the switch unit which cannot be activated normally is maintained in its initial state, that is, if an initial state of a switch unit is a turn-off state, the turn-off state is maintained; or if an initial state of the switch unit is a turn-on state, the turn-on state is maintained. Then, the second battery module is re-obtained based on the above selection strategy. Maintaining the switch unit which cannot be normally activated in the initial state may shield some switch units and battery modules which cannot be normally activated, and may improve the selection efficiency of re-selecting the second battery module.

Figure 4:
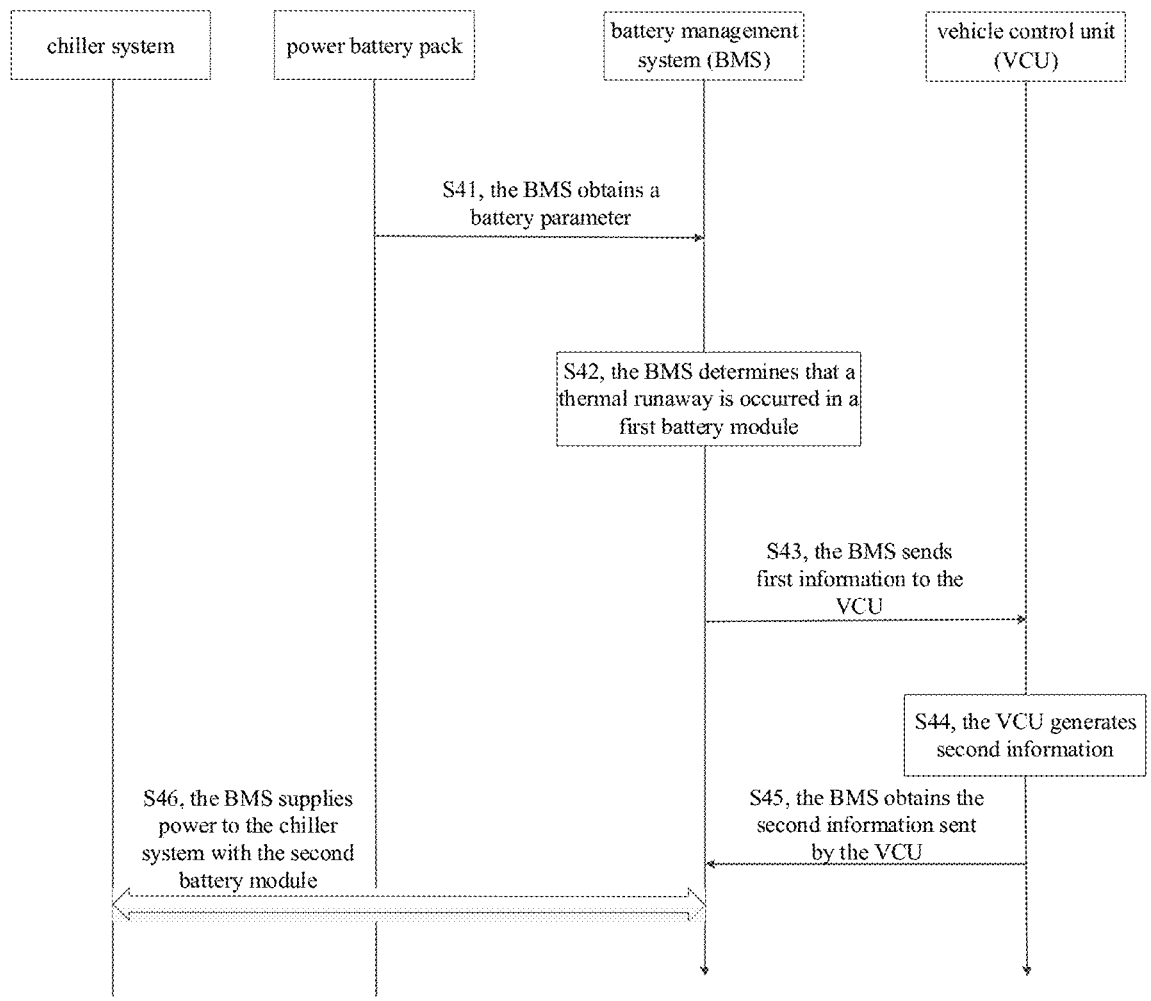
FIG. 4 is a schematic flowchart of a method for thermal runaway processing provided by an embodiment of the present application.

If the step of selecting the second battery module is implemented by the VCU, please refer to FIG. 4, FIG. 4 is a schematic flowchart of a method for thermal runaway processing provided by an embodiment of the present application. As shown in FIG. 4, the method for thermal runaway processing includes the following steps.

In S41, a battery parameter for each of a plurality of battery modules is obtained by the battery management system, wherein the plurality of battery modules form a power battery pack.

In S42, it is determined that a thermal runaway is occurred in a first battery module, by the battery management system, based on the battery parameter for each of the plurality of battery modules.

In S43, first information which includes information of the first battery module is sent, by the battery management system, to the vehicle control unit (VCU).

In S44, second information is generated, by the VCU, based on the rated voltage of the chiller system and the information of the first battery module.

In S45, the second information sent by the VCU is obtained by the battery management system, wherein the second information includes information of the second battery module.

In S46, power is supplied to the chiller system with the second battery module, by the battery management system, wherein the chiller system is configured to cool the power battery pack.

A part of the process of obtaining the second battery module based on the first battery module is implemented by the vehicle control unit (VCU), and the battery management system and the VCU exchange information, in order to complete the step of obtaining the second battery module together. In particular, the battery management system sends the first information which includes information of the first battery module to the vehicle control unit (VCU), so as to cause the VCU to feed back the second information based on the rated voltage of the chiller system and the information of the first battery module, wherein the second information includes information of the second battery module. The rated voltage of the chiller system may be stored in the VCU in advance. After the VCU obtains the information of the first battery module sent to it by the battery management system, the VCU obtains the second battery module based on the rated voltage of the chiller system and the information of the first battery module. The selection strategy for selecting the second battery module is the same as the selection strategy for selecting the second battery module by the battery management system.

In some embodiments, the first information may further include the battery temperature of the power battery pack or the temperature of the cooling liquid, so that the VCU selects the second battery module based on the rated voltage of the chiller system and the battery temperature, or based on the rated voltage of the chiller system and the temperature of the cooling liquid.

Therefore, information may be exchanged between the battery management system and the VCU, the second battery module is selected by the VCU based on the selection strategy, and the second battery module is used by the battery management system to supply power to the chiller system. Thus, a good heat dissipation effect is achieved, and the safety of the power battery pack is improved.

In some embodiments, when detecting the power supply circuit of the second battery module, the battery management system and the VCU exchange information with each other, and the VCU detects the power supply circuit of the second battery module, to detect whether the power supply circuit is normal. In particular, the battery management system sends a voltage difference between voltages at a highest voltage terminal and a lowest voltage terminal of a power supply circuit of the second battery module to the vehicle control unit (VCU), so as to cause the VCU to feed back information of the second battery module based on the voltage difference between voltages at the highest voltage terminal and the lowest voltage terminal of a power supply circuit of the second battery module, wherein the VCU is configured to feed back the information of the second battery module under a condition that the voltage difference between voltages at the highest voltage terminal and the lowest voltage terminal of a power supply circuit of the second battery module is less than or equal to a first preset threshold. The voltage difference being less than or equal to the first preset threshold indicates that the power supply circuit of the second battery module is normal, and then the battery management system obtains the information of the second battery module and uses the second battery module to supply power to the chiller system.

In some further embodiments, the information sent by the battery management system to the VCU is the power of the power supply circuit of the second battery module, and the VCU feeds back information of the second battery module based on the power of the power supply circuit of the second battery module, wherein the VCU feeds back the information of the second battery module under a condition that the power of the power supply circuit of the second battery module is greater than a second preset threshold. The power of the power supply circuit of the second battery module being greater than the second preset threshold indicates that the power supply circuit of the second battery module is normal, and then the battery management system obtains the information of the second battery module and uses the second battery module to supply power to the chiller system.

Therefore, the battery management system sends the voltage difference of the power supply circuit of the second battery module or the power of the power supply circuit of the second battery module to the VCU, and the VCU determines whether the power supply circuit is normal. If it is normal, the VCU feeds back the information of the second battery module to the battery management system, to cause the battery management system to use the second battery module to supply power to the chiller system; or if it is abnormal, the VCU feeds back abnormal information to the battery management system, and a second battery module is re-selected by the battery management system or the VCU.

To sum up, when the thermal runaway is occurred in the battery module in the power battery pack, the method for thermal runaway processing may supply power to the chiller system with the second battery module in which the thermal runaway is not occurred, to cause the chiller system to operate normally, to take away the heat in the power battery pack which is generated due to the thermal runaway, and to cool the power battery pack and dissipate heat from the power battery pack, and thus a good heat dissipation effect is achieved, and the safety of the power battery pack is improved.

In order to set forth the method for thermal runaway processing more clearly and comprehensively, the method for thermal runaway processing will be described in detail below in conjunction with specific embodiments.

Figure 5:
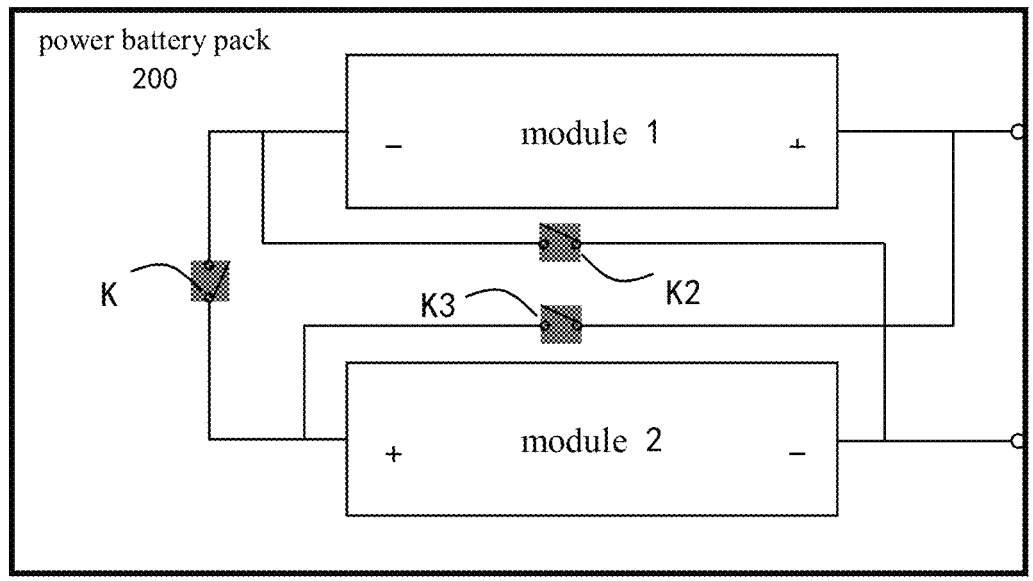
FIG. 5 is a schematic structure diagram of a power battery pack provided by an embodiment of the present application.

Please refer to FIG. 5, FIG. 5 is a schematic structure diagram of a power battery pack provided by an embodiment of the present application. As shown in FIG. 5, the power battery pack 200 includes a module 1 and a module 2, relays K1/K2/K3 in series/parallel circuits and among circuits. The module 1 and the module 2 each represents a battery module consists of a single battery or several batteries connected in series and in parallel, and there are not only a series circuit but also a parallel circuit between the module 1 and the module 2. This means that when the series circuit is opened due to the thermal runaway of a certain battery in the module 1, it is possible that the remained safety batteries in the power battery pack 200 form a high-voltage safety circuit by switching settings between the circuits. FIG. 5 shows a relatively simple series/parallel configuration. In actual situations, a multi-stage series/parallel configuration may be provided based on actual design requirements and connection configurations inside the module. For example, the series/parallel configuration as shown in FIG. 5 may also be set inside the module 1. In this way, when the thermal runaway is occurs in multiple batteries at the same time, there is still an "alternative circuit" to be selected.

The relay K2 and the relay K3 among circuits are active/passive apparatus for cutting off/closing the circuits, controlled by the BMS, and may be driven by current signal/air pressure/temperature and so on. When a thermal runaway state is identified in a battery at somewhere in the power battery pack 200, the first battery module in which the thermal runaway is occurred is determined, and then the second battery module is obtained based on the selection strategy described in the above embodiments, and finally a power supply circuit of the second battery module is realized by switching among circuits via the relays, so as to ensure that the power battery pack 200 still has an available high-voltage safety circuit for the chiller for cooling. The relays may be arranged on the connection paths among modules or sub-modules, or may be arranged at output terminals of a single cell or a single module.

Figure 6:
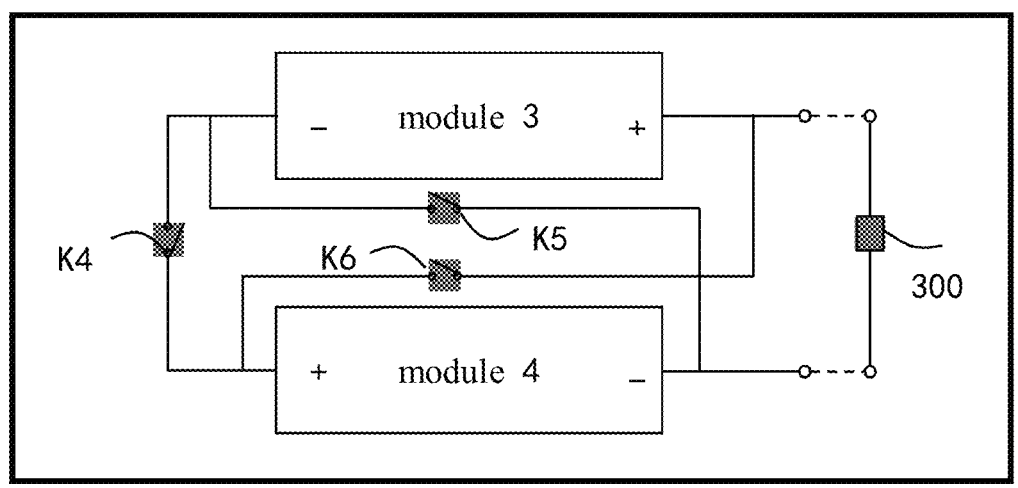
FIG. 6 is a schematic structure diagram of a power battery pack provided by another embodiment of the present application.

In particular, as shown in FIG. 6, if power battery pack 200 includes a module 3, a module 4 and relays K4/K5/K6 and each of the module 3 and the module 4 may provide a voltage of 200V, under a normal operation situation in which the power battery pack 200 needs to be charged/discharged at 400V, the relay K4 is controlled to be turned on, and the relay K5 and the relay K6 are controlled to be turned off, so as to ensure that the power battery pack 200 may be operated normally.

When the thermal runaway is occurred in a single battery in the power battery pack 200, the occurring of the thermal runaway is detected by the BMS with the parameters (including voltage/temperature/air pressure/communication signal and so on) of the battery module, and the BMS determines that the thermal runaway occurred in the first battery module. Assuming that the first battery module is the module 3, and the BMS obtains the second battery module, which is the module 4, by a logic stored in advance, then the BMS may output a relay switching strategy to the vehicle control unit (VCU). The vehicle control unit (VCU) controls, based on the relay switching strategy, the relay K6 to be turned on, the relay K4 and the relay K5 to be turned off, to disconnect the battery module in which the thermal runaway is occurred, so that the battery module (the module 4) in which the thermal runaway is not occurred forms a high-voltage safety circuit. The BMS uses the module 4 to supply power to the chiller in the chiller system 300. At the same time, the VCU starts the water pump to circulate the cooling liquid, and the chiller of the chiller system 300 forcibly cools the cooling liquid, to accelerate the heat dissipation inside the power battery pack 200, particularly the high temperature area near the battery module in which the thermal runaway is occurred.

Figure 7:
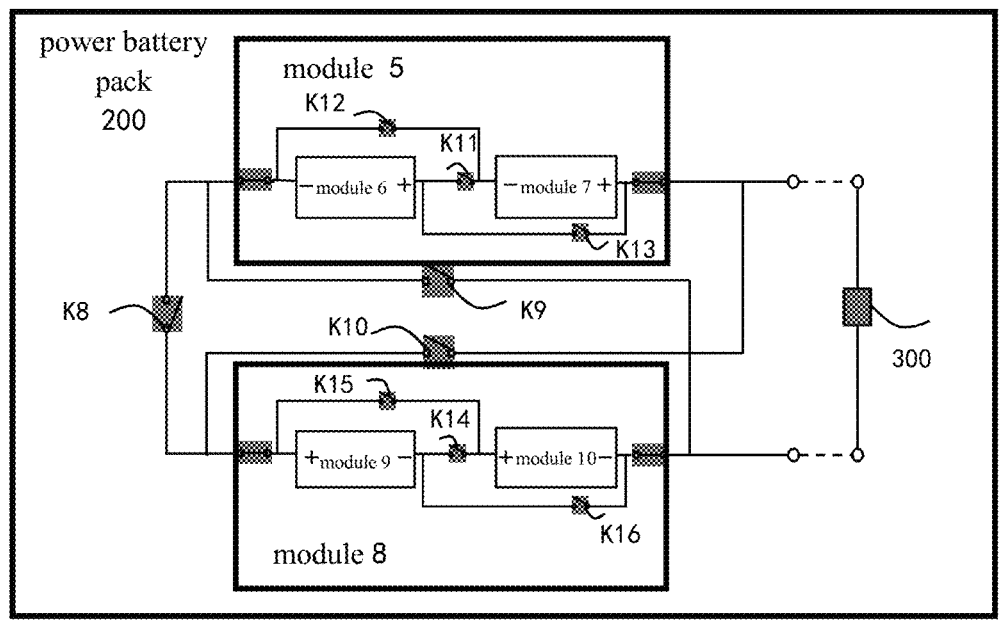
FIG. 7 is a schematic structure diagram of a power battery pack provided by yet another embodiment of the present application.

Please refer to FIG. 7, as shown in FIG. 7, this power battery pack 200 includes a module 6, a module 7, a module 9 and a module 10, each of the module 6, the module 7, the module 9 and the module 10 may provide a voltage of 100V, the module 6 and the module 7 may be connected in series to form a module 5, which may provide a voltage of 200V to the outside, and the module 9 and the module 10 may be connected in series to form a module 8, which may provide a voltage of 200V to the outside. The power battery pack further includes relays K8/K9/K10/K11/K12/K13/K14/K15/K16, and multiple high-voltage circuits may be formed by controlling the state of the respective relays.

Under a normal operation situation in which the power battery pack 200 needs to be charged/discharged at 400V, the relay K8, the relay K11 and the relay K14 are in a turned-on state, the relay K9, the relay K10, the relay K12, the relay K13, the relay K15 and the relay K16 are in a turned-off state, and the module 6, the module 7, the module 9 and the module 10 form a series circuit, to ensure that the power battery pack 200 may be operated normally and output the voltage of 400V normally.

When the thermal runaway is occurred in a single battery module or two battery modules in power battery pack 200 simultaneously, the BMS detects that a thermal runaway alarm is occurred based on the sampled signal (including voltage/temperature/air pressure/communication signal). The BMS positions the battery in which the thermal runaway is occurred, by a preset logic, to determine the first battery module (assuming that the thermal runaway is occurred in the module 6 and module 9), and then determines, by a logic stored in advance, that only the circuits where the module 7 and the module 10 are located are still in a safe state. At this time, in the circuits, two high-voltage safety circuits are possible to be constructed, namely, a 100V-high-voltage safety circuit and a 200V-high-voltage safety circuit. If the rated voltage of the chiller system is less than 100V, the second battery module may be the module 7 or the module 10 or both the module 7 and the module 10. If the rated voltage of the chiller system is greater than 100V and less than 200V, the second battery module is the module 7 and the module 10. Therefore, based on the preset logic, the second battery module and its power supply circuit are obtained.

If the 200V-high-voltage safety circuit is selected, the BMS may output a relay switching strategy to the vehicle control unit (VCU), and the vehicle control unit (VCU) controls the relay K8, the relay K12 and the relay K15 to be turned on correspondingly, and controls the relay K9, the relay K10, the relay K11, the relay K13, the relay K14 and the relay K16 to be turned off correspondingly, to cut off the high-voltage connections to the other battery modules in the power battery pack 200 to form the high-voltage safety circuit.

The BMS outputs signal to the vehicle control unit (VCU), to start the water pump to circulate the cooling liquid, while uses the above high-voltage safety circuit to supply power to the chiller system 300 to start the chiller in the chiller system 300, to forcibly cool the cooling liquid, and to accelerate the heat dissipation inside the power battery pack 200, particularly the high temperature area near the battery module in which the thermal runaway is occurred.

If at this moment the thermal runaway is occurred in another certain battery module (assuming that it is module 7), the BMS detects that a thermal runaway alarm is occurred based on the sampled signal (including voltage/temperature/air pressure/communication signal). The BMS positions the battery module in which the thermal runaway is occurred, by a preset logic, to determine the module 7 in which the thermal runaway is occurred (at this time, the module 6, the module 7 and the module 9 are the first battery module), and determines, by a logic stored in advance, that only the circuits where the module 10 is located are still in a safe state (at this time, the module 10 is the second battery module). At this time, in the circuits, a high-voltage safety circuit is possible to be constructed, namely, a 100V-high-voltage safety circuit. The BMS outputs a relay switching strategy to the vehicle control unit (VCU), and the vehicle control unit (VCU) controls the relay K10 and the relay K15 to be turned on correspondingly, and controls the relay K8, the relay K9, the relay K11, the relay K12, the relay K13, the relay K14 and the relay K16 to be turned off correspondingly, to cut off the 200V-high-voltage safety circuit, so as to form another high-voltage safety circuit.

The BMS outputs signal to the vehicle control unit (VCU), to start the water pump to circulate the cooling liquid, while uses the above high-voltage safety circuit to supply power to the chiller in the chiller system 300 to start the chiller, to forcibly cool the cooling liquid, and to accelerate the heat dissipation inside the power battery pack 200, particularly the high temperature area near the battery module in which the thermal runaway is occurred.

To sum up, when the thermal runaway is occurred in the battery module in the power battery pack, the method for thermal runaway processing may supply power to the chiller system with the second battery module in which the thermal runaway is not occurred, to cause the chiller system to operate normally, to take away the heat in the power battery pack which is generated due to the thermal runaway, and to cool the power battery pack and dissipate heat from the power battery pack, and thus a good heat dissipation effect is achieved, and the safety of the power battery pack is improved.

Figure 8:
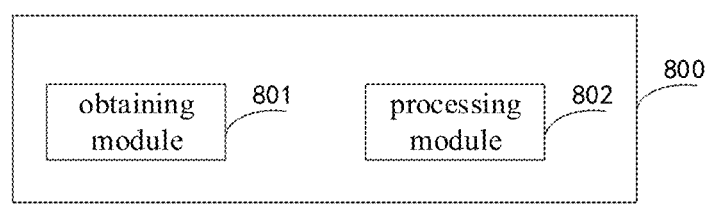
FIG. 8 is a schematic structure diagram of an apparatus for thermal runaway processing provided by an embodiment of the present application.

FIG. 8 is a schematic structure diagram of an apparatus for thermal runaway processing provided by an embodiment of the present application. The apparatus for thermal runaway processing 800 includes an obtaining module 801 configured to obtain a battery parameter for each of a plurality of battery modules, wherein the plurality of battery modules form a power battery pack; and a processing module 802 configured to determine that a thermal runaway is occurred in a first battery module based on the battery parameter for each of the plurality of battery modules. The processing module 802 is further configured to obtain a second battery module based on the first battery module, wherein the second battery module corresponds to at least one battery module excluding the first battery module in the power battery pack, and the processing module 802 is further configured to supply power to a chiller system with the second battery module, wherein the chiller system is configured to cool the power battery pack.

Therefore, in this embodiment, when the thermal runaway is occurred in the battery module in the power battery pack, the apparatus for thermal runaway processing may supply power to the chiller system with the second battery module in which the thermal runaway is not occurred, to cause the chiller system to operate normally, to take away the heat in the power battery pack which is generated due to the thermal runaway, and to cool the power battery pack and dissipate heat from the power battery pack, and thus a good heat dissipation effect is achieved, and the safety of the power battery pack is improved.

In some embodiments, the processing module 802 is configured to: obtain the second battery module based on the first battery module and a rated voltage of the chiller system, wherein an output voltage of the second battery module is greater than or equal to the rated voltage of the chiller system.

In some embodiments, the processing module 802 is configured to: send, to a vehicle control unit (VCU), first information which includes information of the first battery module, so as to cause the VCU to generate second information based on the rated voltage of the chiller system and the information of the first battery module; and obtain the second information sent by the vehicle control unit, wherein the second information includes information of the second battery module.

In some embodiments, the processing module 802 is configured to: obtain the rated voltage of the chiller system sent by a Vehicle Control Unit (VCU); and obtain the second battery module based on the rated voltage of the chiller system and the first battery module.

In some embodiments, the processing module 802 is configured to: obtain the second battery module, under a condition that a voltage difference between voltages at a highest voltage terminal and a lowest voltage terminal of a power supply circuit of the second battery module is less than or equal to a first preset threshold, and/or under a condition that a power of the power supply circuit of the second battery module is greater than a second preset threshold.

In some embodiments, the processing module 802 is configured to:

send, to a vehicle control unit, a voltage difference between voltages at a highest voltage terminal and a lowest voltage terminal of a power supply circuit of the second battery module, so as to cause the vehicle control unit to feed back information of the second battery module based on the voltage difference, wherein the vehicle control unit is configured to feed back the information of the second battery module under a condition that the voltage difference is less than or equal to a first preset threshold; and obtain the information of the second battery module.

In some embodiments, the battery parameter includes a real-time voltage of a battery module; and the processing module 802 is configured to: determine that the thermal runaway is occurred in the first battery module, under a condition that a difference between a real-time voltage of the first battery module and a reference voltage is greater than or equal to a third preset threshold, and/or under a condition that a rate of change on the real-time voltage of the battery module is greater than or equal to a fourth preset threshold, and/or under a condition that a sampling for the real-time voltage of the battery module is abnormal.

It should be noted that, as the apparatus for thermal runaway processing and the method for thermal runaway processing in the above-mentioned embodiments are based on the same inventive concept, the corresponding contents in the above described method embodiments are equally applicable to the apparatus embodiments, which will not be repeated in detail here.

Therefore, when the thermal runaway is occurred in the battery module in the power battery pack, the apparatus for thermal runaway processing may supply power to the chiller system with the second battery module in which the thermal runaway is not occurred, to cause the chiller system to operate normally, to take away the heat in the power battery pack which is generated due to the thermal runaway, and to cool the power battery pack and dissipate heat from the power battery pack, and thus a good heat dissipation effect is achieved, and the safety of the power battery pack is improved.

The embodiments of the present application further provide a non-transitory computer-readable storage medium, wherein the non-transitory computer-readable storage medium is stored with computer-executable instructions, the computer-executable instructions, when executed by the one or more processors such a processor 101 in FIG. 2, may cause the above one or more processors to perform the method for thermal runaway processing in any of the above method embodiments.

The embodiments of the present application further provide a computer program product, the computer program product includes a computer program stored on a non-transitory computer-readable storage medium, the computer program includes program instructions, and the program instructions, when executed by a control unit, cause the control unit to perform the method for thermal runaway processing in any of the embodiments.

Through the description of the above embodiments, a person skilled in the art may clearly understand that each embodiment may be implemented by means of software and general hardware platform, or certainly may be implemented by hardware. A person skilled in the art may understand that all or part of the processes in the methods of the above embodiments may be implemented by instructing the relevant hardware through a computer program in a computer program product. The computer program may be stored in a non-transitory computer readable storage medium, the computer program includes program instructions, and the program instructions, when executed by a UAV, cause the UAV to perform the processes of the above embodiments of the method. The storage medium may be a magnetic disk, an optical disk, a Read-Only Memory (ROM), or a Random Access Memory (RAM) or the like.

The above-mentioned product may implement the method for thermal runaway processing provided by the embodiments of the application, and have functional modules and beneficial effects corresponding to the method for thermal runaway processing. For technical details which are not described in detail in this embodiment, reference may be made to the method for thermal runaway processing provided in the embodiments of the present application.

Finally it should be noted that: the above embodiments only intend to illustrate the technical solution of the application, rather than limit it. Under the concept of the application, the technical features in the above embodiments or different embodiments may further be combined, the steps may be implemented in any order, and there are many other variations of the different aspects of the application as described above, which are not provided in detail for the sake of brevity. Although the application has been described in detail with reference to the above content, a person skilled in the art should understand that: she/he may further modify the technical solutions described in the above embodiments, or perform equivalent replacements to some of the technical features; and these modifications or replacements do not make the corresponding technical solutions deviate from the scope of the technical solutions of the various embodiments of the present invention essentially.

What is claimed is:
1. A method for thermal runaway processing, performed by a battery management system (BMS), comprising:
obtaining a battery parameter for each of three or more battery modules, wherein the three or more battery modules form a power battery pack, and each of the three or more battery modules is communicatively coupled to the BMS;

determining that a thermal runaway is occurred in a first battery module based on the battery parameter for each of the three or more battery modules;

obtaining a second battery module based on the first battery module, wherein the second battery module corresponds to at least one of the three or more battery modules excluding the first battery module in the power battery pack; and supplying power to a chiller system with the second battery module, wherein the chiller system is configured to cool the power battery pack, wherein obtaining the second battery module based on the first battery module comprises:

selecting, from the three or more battery modules excluding the first battery module in the power battery pack, the second battery module based on a rated voltage of the chiller system and a battery temperature in the power battery pack or based on the rated voltage of the chiller system and a temperature of a cooling liquid, wherein an output voltage of the second battery module is greater than or equal to the rated voltage of the chiller system.

2. The method according to claim 1, wherein obtaining the second battery module based on the first battery module comprises:

sending, to a vehicle control unit (VCU), first information which comprises information of the first battery module, so as to cause the VCU to generate second information based on the rated voltage of the chiller system and the first information; and obtaining the second information sent by the VCU, wherein the second information comprises information of the second battery module.

3. The method according to claim 1, wherein obtaining the second battery module based on the first battery module comprises:

obtaining the rated voltage of the chiller system sent by a Vehicle Control Unit (VCU); and obtaining the second battery module based on the rated voltage of the chiller system and the first battery module.

4. The method according to claim 1, wherein obtaining the second battery module based on the first battery module comprises:

obtaining the second battery module, under at least one of conditions:

a voltage difference between voltages at a highest voltage terminal and a lowest voltage terminal of a power supply circuit of the second battery module is less than or equal to a first preset threshold, and a power of the power supply circuit of the second battery module is greater than a second preset threshold.

5. The method according to claim 1, wherein obtaining the second battery module based on the first battery module comprises:

sending, to a vehicle control unit (VCU), a voltage difference between voltages at a highest voltage terminal and a lowest voltage terminal of a power supply circuit of the second battery module, so as to cause the VCU to feed back information of the second battery module based on the voltage difference, wherein the VCU is configured to feed back the information of the second battery module under a condition that the voltage difference is less than or equal to a first preset threshold; and obtaining the information of the second battery module.

6. The method according to claim 1, wherein the battery parameter comprises a real-time battery module voltage, wherein determining that the thermal runaway is occurred in the first battery module based on the battery parameter for each of the three or more battery modules comprises:

determining that the thermal runaway is occurred in the first battery module, under at least one of conditions:

a difference between a real-time battery module voltage of the first battery module and a reference voltage is greater than or equal to a third preset threshold, and a rate of change on the real-time battery module voltage of the first battery module is greater than or equal to a fourth preset threshold, and a sampling for the real-time battery module voltage of the first battery module is abnormal.

7. A battery management system, comprising:

at least one processor; and a memory communicatively coupled to the at least one processor, wherein the memory is stored with instructions executable by the at least one processor, and the instructions, when executed by the at least one processor, cause the at least one processor to perform the method for thermal runaway processing according to claim 1.

8. A non-transitory computer-readable storage medium, wherein the non-transitory computer-readable storage medium is stored with computer-executable instructions for implementing the method for thermal runaway processing according to claim 1.

9. A system for thermal runaway processing, comprising the battery management system according to claim 7.

* * * * *